(12) United States Patent
Werner et al.

(10) Patent No.: US 10,079,284 B2
(45) Date of Patent: Sep. 18, 2018

(54) METHOD OF MANUFACTURING A SEMICONDUCTOR STRUCTURE AND SEMICONDUCTOR DEVICE

(71) Applicant: Infineon Technologies AG, Neubiberg (DE)

(72) Inventors: Wolfgang Werner, Munich (DE); Peter Irsigler, Obernberg/Inn (AT); Andreas Meiser, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/220,794

(22) Filed: Jul. 27, 2016

(65) Prior Publication Data

US 2017/0033189 A1  Feb. 2, 2017

(30) Foreign Application Priority Data

Jul. 29, 2015 (DE) .............. 10 2015 112 414

(51) Int. Cl.
| | |
|---|---|
| *H01L 29/40* | (2006.01) |
| *H01L 21/308* | (2006.01) |
| *H01L 21/762* | (2006.01) |
| *H01L 21/765* | (2006.01) |
| *H01L 29/423* | (2006.01) |

(Continued)

(52) U.S. Cl.
CPC ......... *H01L 29/407* (2013.01); *H01L 21/308* (2013.01); *H01L 21/3083* (2013.01); *H01L 21/765* (2013.01); *H01L 21/76224* (2013.01); *H01L 29/404* (2013.01); *H01L 29/41766* (2013.01); *H01L 29/4236* (2013.01); *H01L 29/66666* (2013.01); *H01L 29/66696* (2013.01); *H01L 29/66704* (2013.01); *H01L 29/7825* (2013.01); *H01L 29/7827* (2013.01); *H01L 29/0696* (2013.01); *H01L 29/0804* (2013.01); *H01L 29/1083* (2013.01);

(Continued)

(58) Field of Classification Search
CPC ......... H01L 29/66681; H01L 29/66689; H01L 29/7825; H01L 21/308; H01L 21/3081
See application file for complete search history.

(56) References Cited

U.S. PATENT DOCUMENTS

| | | |
|---|---|---|
| 2003/0047792 A1 | 3/2003 | Disney |
| 2017/0092718 A1* | 3/2017 | Murata et al. .... H01L 21/02216 |

FOREIGN PATENT DOCUMENTS

| | | |
|---|---|---|
| DE | 102004056772 A1 | 6/2006 |
| WO | WO 2005/045938 A2 | 5/2005 |

OTHER PUBLICATIONS

Office Action communication of the German Patent and Trademark Office for Appln. Ser. No. 102015112414.9, dated Jun. 5, 2016.

* cited by examiner

*Primary Examiner* — Marcos D Pizarro
*Assistant Examiner* — Shannon Yi
(74) *Attorney, Agent, or Firm* — Slater Matsil, LLP

(57) ABSTRACT

A method of manufacturing a structure in a semiconductor body comprises forming a first mask above a first surface of the semiconductor body. The first mask comprises an opening surrounding a first portion of the first mask, thereby separating the first portion and a second portion of the first mask. The semiconductor body is processed through the opening at the first surface. The opening is increased by removing at least part of the first mask in the first portion while maintaining the first mask in the second portion. The semiconductor body is further processed through the opening at the first surface.

20 Claims, 8 Drawing Sheets

(51) Int. Cl.
  *H01L 29/66*   (2006.01)
  *H01L 29/78*   (2006.01)
  *H01L 29/417*  (2006.01)
  *H01L 29/73*   (2006.01)
  *H01L 29/08*   (2006.01)
  *H01L 29/06*   (2006.01)
  *H01L 29/10*   (2006.01)
(52) U.S. Cl.
  CPC .... *H01L 29/1095* (2013.01); *H01L 29/66234* (2013.01); *H01L 29/73* (2013.01)

METHOD OF MANUFACTURING A SEMICONDUCTOR STRUCTURE AND SEMICONDUCTOR DEVICE

CROSS REFERENCE TO RELATED APPLICATION

This application claims priority to German Application Serial No. 102015112414.9 filed Jul. 29, 2015 and entitled "Method of Manufacturing a Semiconductor Structure and Semiconductor Device".

BACKGROUND

In semiconductor devices, for example power semiconductor devices such as insulated gate bipolar transistors (IGBTs), insulated gate field effect transistors (IGFETs), for example metal oxide semiconductor field effect transistors (MOSFETs), and bipolar junction transistors (BJTs), alignment of semiconductor structures, for example dielectric(s), semiconductor region(s) or metal(s) relative to each other is required to meet requirements on reliability and/or target values of electric parameters.

It is desirable to improve alignment of semiconductor structures by providing a method for manufacturing semiconductor structures in a semiconductor body and a semiconductor device comprising aligned semiconductor structures.

SUMMARY

The present disclosure relates to a method of manufacturing a structure in a semiconductor body. The method comprises forming a first mask above a first surface of the semiconductor body. The first mask comprises an opening surrounding a first portion of the first mask, thereby separating the first portion and a second portion of the first mask. The semiconductor body is processed through the opening at the first surface. The opening is increased by removing at least part of the first mask in the first portion while maintaining the first mask in the second portion. The semiconductor body is further processed through the opening at the first surface.

The present disclosure also relates to a semiconductor device. The semiconductor device comprises a field electrode trench in a semiconductor body comprising opposite first and second surfaces. The semiconductor device further comprises a field dielectric in the field electrode trench. The field dielectric lines a side surface of the field electrode trench. A width of the field dielectric at half of a depth between the first surface and a bottom side of the field electrode trench varies between a first width and a second width along a loop surrounding the field electrode trench. A ratio between the first and second widths is greater than two.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and together with the description serve to explain principles of the disclosure. Other embodiments and intended advantages will be readily appreciated as they become better understood by reference to the following detailed description.

DETAILED DESCRIPTION

Figure 1:
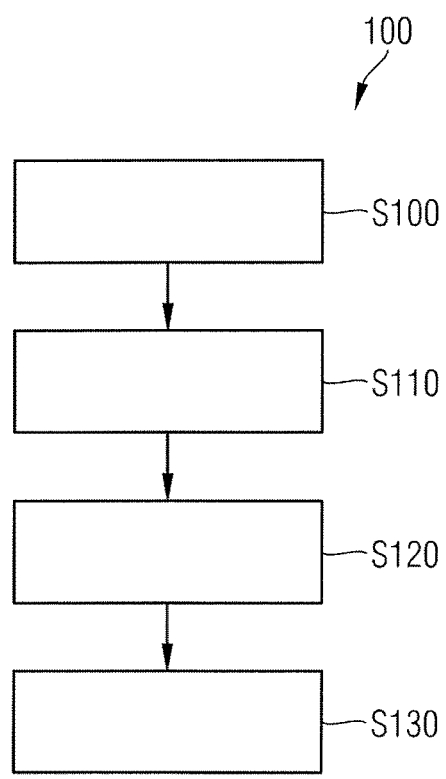
FIG. 1 is a schematic flow diagram for illustrating a method of manufacturing a semiconductor device.

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration that is lower than the doping concentration of an "n"-doping region while an doping region has a higher doping concentration than an "n$^+$"-doping region. Doping regions of the same relative doping concentration do not necessarily have the same absolute doping concentration. For example, two different "n"-doping regions may have the same or different absolute doping concentrations.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures.

The semiconductor need not be silicon-based. The semiconductor could as well be silicon germanium (SiGe), germanium (Ge) or gallium arsenide (GaAs). According to other embodiments, silicon carbide (Sic) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a semiconductor die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside or rear surface while the first surface is considered to be formed by the upper, front or main surface of the semiconductor substrate. The terms "above" and "below" as used in this specification therefore describe a relative location of a structural feature to another.

In this specification, embodiments are illustrated including p- and n-doped semiconductor regions. Alternatively, the semiconductor devices can be formed with opposite doping relations so that the illustrated p-doped regions are n-doped and the illustrated n-doped regions are p-doped.

The semiconductor device may have terminal contacts such as contact pads (or electrodes) which allow electrical contact to be made with the integrated circuit or discrete semiconductor device included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), physical vapor deposition (PVD), evaporation, hybrid physical-chemical vapor deposition (HPCVD), etc.

The applied conductive layer may comprise, inter alia, one or more of a layer of metal such as Al, Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the wafer into individual chips. Any technique for dicing may be applied, e.g., blade dicing (sawing), laser dicing, etching, etc. The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above mentioned techniques, and pull the tape, e.g., along four orthogonal directions in the plane of the tape. By pulling the tape, the semiconductor wafer gets divided into a plurality of semiconductor dies (chips).

FIG. 1 is a schematic flow diagram for illustrating a method 100 of manufacturing a semiconductor structure in a semiconductor body.

It will be appreciated that while method 100 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

Process feature S100 comprises forming a first mask above a first surface of the semiconductor body, the first mask comprising an opening surrounding a first portion of the first mask, thereby separating the first portion and a second portion of the first mask.

Process feature S110 comprises processing the semiconductor body through the opening at the first surface.

Process feature S120 comprises increasing the opening by removing at least part of the first mask in the first portion while maintaining the first mask in the second portion. In some embodiments, process feature S120 comprises forming a second mask above the first and comprising an opening above the at least part of the first mask in the first portion.

Process feature S130 comprises further processing the semiconductor body through the opening at the first surface.

The method allows for an improved alignment of an inner structure relative to an outer structure surrounding the inner structure.

In some embodiments, the opening constitutes a loop at the first surface and a width of the loop at the first surface varies between a first width and a second width, a ratio between the first and second widths being greater than two, or greater than three, or even greater than five. In some embodiments, the first and second widths range between 50 nm and 10 µm. In some embodiments, the loop comprises first and second sections, wherein a profile of width of the opening along the loop in the first section equals a profile of width of the opening along the loop in the second section.

In some embodiments, the process of increasing the opening comprises completely removing the first mask in the first portion.

In some embodiments, the process of increasing the opening further comprises forming a second mask above the first mask, the second mask covering the second portion of the first mask and comprising an opening above the at least part of the first mask in the first portion. The first mask may be removed in an area of the opening above the at least part of the first mask in the first portion, for example by a selective etch process leaving an underlying material, for example the material of the semiconductor body unharmed.

In some embodiments, processing the semiconductor body through the opening at the first surface comprises forming a first trench in the semiconductor body and filling the first trench with a first material.

In some embodiments, the process of filling the trench with a first material includes forming a first dielectric and filling at least 80% of the first trench with the first material, and wherein a projection of the first material on the first surface constitutes a loop, a width of the first material at half of a depth between the first surface and a bottom side of the first trench varying between a first width and a second width along the loop, a ratio between the first and second widths being greater than two.

In some embodiments, further processing the semiconductor body through the opening at the first surface includes forming a second trench in the semiconductor body.

In some embodiments, sidewalls of the second trench are lined with a second material. In some embodiments, the second material is formed directly on the first material. The first dielectric may be a field dielectric comprising an oxide of silicon. In some embodiments, a second dielectric is formed at a bottom side of the second trench and in direct contact with the first dielectric material, and a conductive material is formed in the second trench. In some embodiments, a gate trench is formed at a lateral distance from the second trench, and a gate dielectric and a gate electrode are formed in the gate trench. Source and drain contacts may be formed at the first surface, wherein the source contact, the gate trench, the second trench and the drain contact may be consecutively arranged along a first lateral direction.

In some embodiments, forming at least one of the source and drain contacts comprises forming a contact trench in the semiconductor body.

In some embodiments, forming the gate trench comprises forming a plurality of gate trenches consecutively arranged along a second lateral direction other than the first lateral direction, and wherein the first mask comprises a plurality of openings and first portions arranged along the second lateral direction.

Figure 2A:
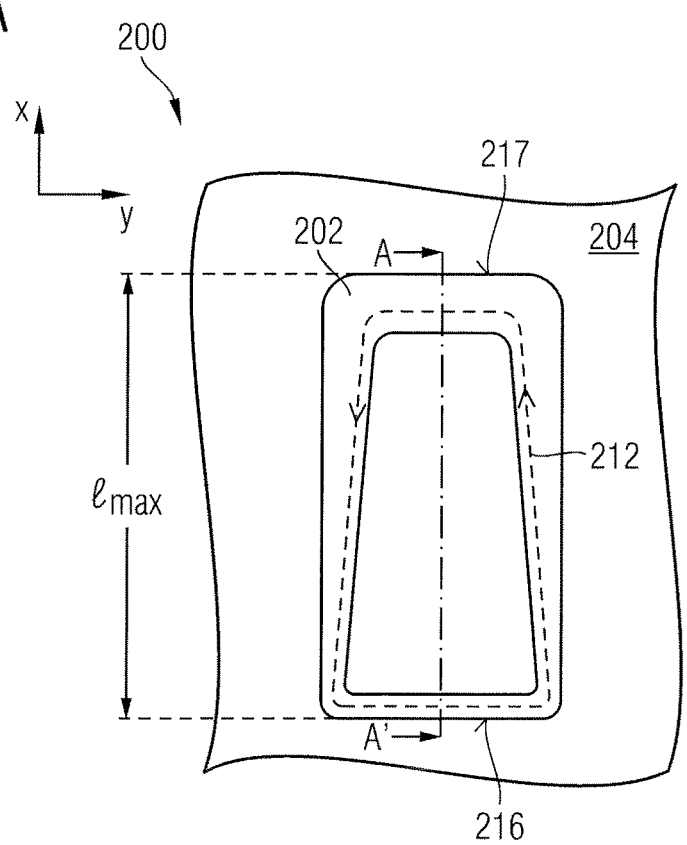
FIG. 2A is a schematic top view of a semiconductor device including a field dielectric according to an embodiment.
Figure 2B:
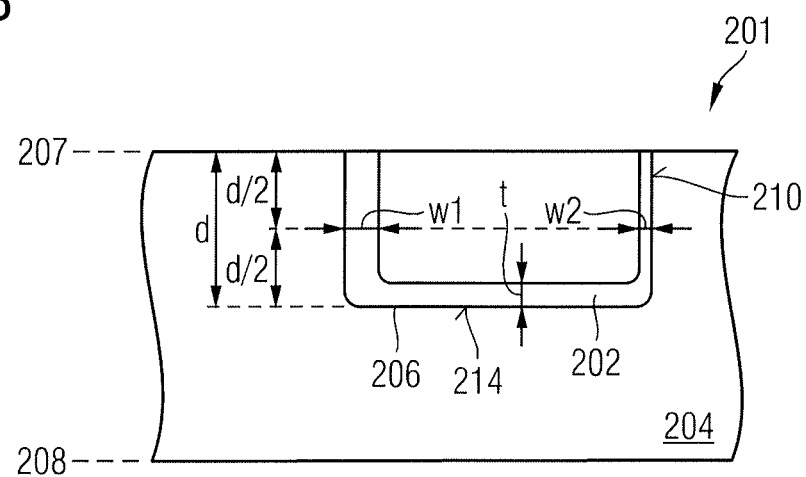
FIG. 2B is a schematic cross-sectional view of the semiconductor device of FIG. 2A along cut line A-A'.

FIG. 2A is a schematic top view 200 illustrating a semiconductor device comprising a field dielectric 202 in a semiconductor body 204 according to an embodiment. FIG. 2B is a cross-sectional view 201 along line cut line A-A' of FIG. 2A.

The semiconductor device comprises a field electrode trench 206 in the semiconductor body 204 comprising opposite first and second surfaces 207, 208. The field dielectric 202 is formed in the field electrode trench 206. The field dielectric 202 lines a side surface 210 of the field electrode trench 206. A width of the field dielectric 202 at half of a depth d between the first surface 207 and a bottom side 214 of the field electrode trench 206 varies between a first width w1 and a second width w2 along a loop 212 encompassing the field electrode trench 206, a ratio between the first and second widths w1/w2 being greater than two. In some other embodiments, the ratio between the first and second widths w1/w2 is greater than three, or even greater than five.

In some embodiments, the field electrode trench 206 has a maximum lateral dimension lmax along a first lateral direction x, and the width of the field dielectric 202 at half of the depth d between the first surface 207 and the bottom side 214 of the field electrode trench 206 steadily increases at the side surface 210 along at least 50% of the lateral dimension lmax.

In some embodiments, the field electrode trench 206 of the semiconductor device comprises opposite first and second front faces 216, 217 being end parts of the field electrode trench 206 in the first lateral direction x. A ratio of widths of the field dielectric 202 at the first and second front faces 216, 217 at half of a depth d between the first surface 207 and the bottom side 214 of the field electrode trench 206 is greater than two.

In some embodiments, the field electrode trench 206 of the semiconductor device has a maximum lateral dimension lmax along the first lateral direction x. A thickness t of the field dielectric 202 at the bottom side 214 of the field electrode trench 206 is constant along at least 50% of the lateral dimension lmax.

In some embodiments, the semiconductor device further comprises a gate trench at a lateral distance from the field electrode trench, the gate trench comprising a gate dielectric and a gate electrode. The semiconductor device may further comprise source and drain contacts at the first surface, wherein the source contact, the gate trench, the field electrode trench and the drain contact are consecutively arranged along the first lateral direction x.

In some embodiments, the gate trench is consecutively arranged multiple times along a second lateral direction y other than the first lateral direction x, and the field electrode trench 206 is consecutively arranged multiple times along the second lateral direction y. The first and second lateral directions x, y may be perpendicular to each other, or may be arranged at an angle of less than 90°, for example.

In some embodiments, at least one of the source and drain contacts includes a contact trench in the semiconductor body 204.

FIGS. 3A to 9B are schematic top views and cross-sectional views of a semiconductor body 304 for illustrating a method of manufacturing a semiconductor device.

Figure 3A:
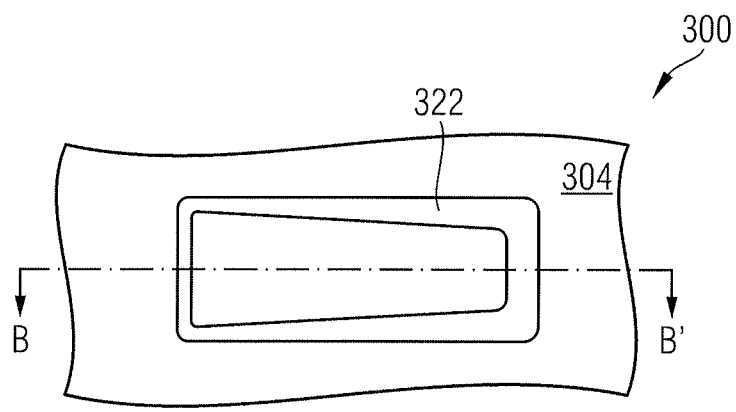
FIGS. 3A to 9B are top views and cross-sectional views for illustrating a method for manufacturing a lateral IGFET according an embodiment.
Figure 3B:
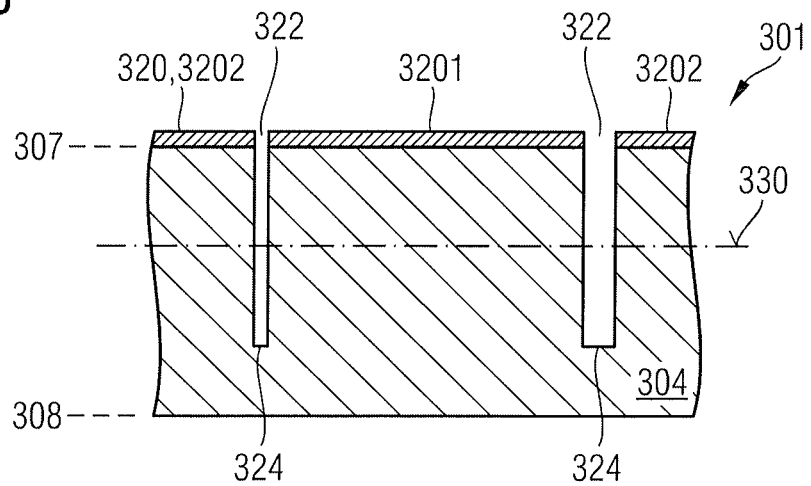

A schematic top view 300 of a semiconductor body 304 is illustrated in FIG. 3A and a schematic cross-sectional view 301 along cut line B-B' of FIG. 3A is illustrated in FIG. 3B. The schematic top view 300 is taken at a vertical level indicated by a dashed line 330 in FIG. 3B.

A first mask 320 is formed above a first surface 307 of the semiconductor body 304. The first surface 307 is opposite to a second surface 308. By way of example, the first surface 307 may be a front surface of the semiconductor body 304 and the second surface 308 may be a back surface of the semiconductor body 304. The semiconductor body may be mounted on a carrier, for example a lead frame of a chip via the back surface, for example, by using a solder or solderless connection technique.

The first mask 320 may be formed by lithographic patterning of a mask material, for example by patterning of a hard mask material and/or resist material, for example. Examples of hard mask materials include materials such as nitrides, for example silicon nitride, oxides, for example silicon oxide, carbon, polycrystalline silicon and any combination thereof, for example a layer stack of a material combination. A material or combination of materials constituting the mask material may be chosen so as to achieve a selectivity to an underlying material when removing or patterning the mask material. The first mask 320 comprises an opening 322 surrounding a first portion 3201 of the first mask 320, thereby separating the first portion 3201 and a second portion 3202 of the first mask 320. The opening 322 constitutes a loop at the first surface 307 running around the first portion 3201 of the first mask 320.

The semiconductor body 304 is processed through the opening 322 at the first surface 307 by an anisotropic etch process removing material of the semiconductor body 304, thereby forming a first trench 324 in the semiconductor body 304. The first trench 324 is also formed as a loop. Anisotropic etching may be carried out as dry etching such as reactive-ion etching, for example.

Figure 4A:
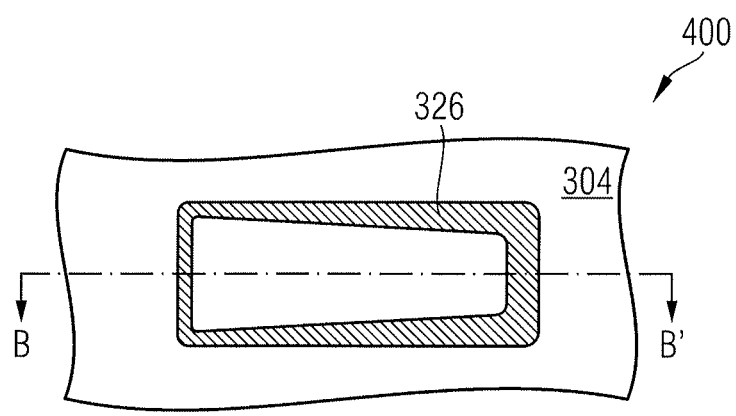
Figure 4B:
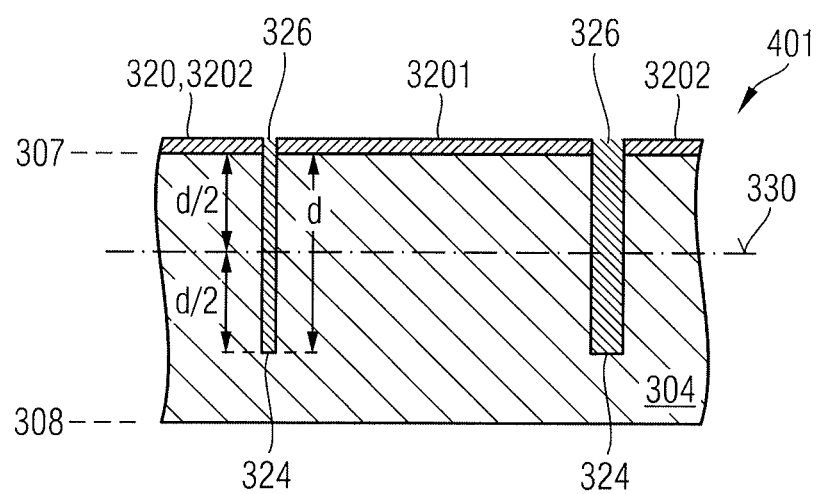

Referring a schematic top view 400 of the semiconductor body 304 illustrated in FIG. 4A and a schematic cross-sectional view 401 along cut line B-B' of FIG. 4A, the first trench 324 is filled with a first material 326. In some embodiments, the first material 326 is a dielectric, for example an oxide of silicon such as a thermal oxide and/or an in-situ steam generated oxide (ISSG) and/or tetraethylorthosilicate (TEOS) silicon oxide, for example. The first material 326 may be chosen such that a material of the semiconductor body 304 may be etched with high selectivity with respect to the first material, for example.

In some embodiments, at least 80% of the first trench 324 is filled with the first material 326, wherein a projection of the first material 326 on the first surface 307 constitutes a loop. A width of the first material at half of a depth d between the first surface 307 and a bottom side of the first trench 324 varies between a first width and a second width along the loop, a ratio between the first and second widths being greater than two.

Figure 5A:
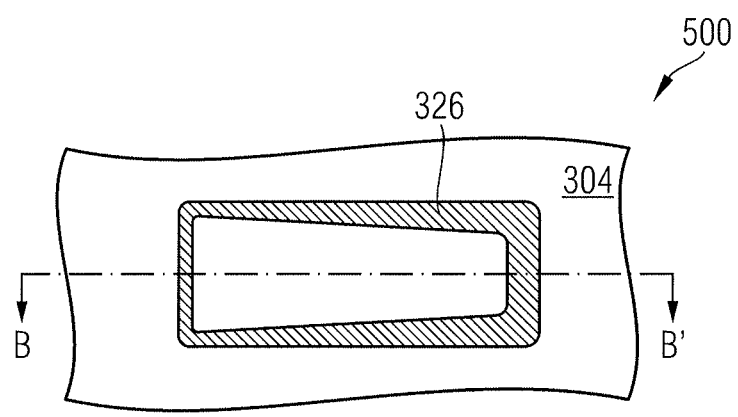
Figure 5B:
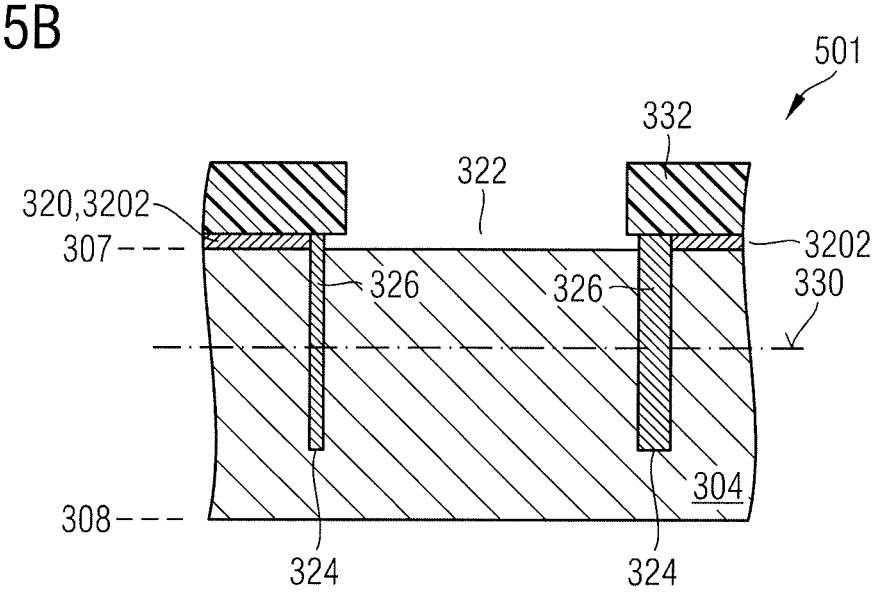

Referring to a schematic top view 500 of the semiconductor body 304 illustrated in FIG. 5A and a schematic cross-sectional view 501 along cut line B-B' of FIG. 5A, the opening 322 is increased by removing the first mask 320 in the first portion 3201 while maintaining the first mask 320 in the second portion 3202. In some other embodiments, the first mask 320 is partly removed in the first portion 3201. The process of increasing the opening 322 may comprise forming a second mask 332 above the first mask 320, the second mask 332 covering the second portion 3202 of the first mask 320 and comprising an opening above at least part of the first mask 320 in the first portion 3201. An uncovered part of the first mask 320 in the first portion is removed through the opening of the second mask 332, for example by an etch process.

Figure 6A:
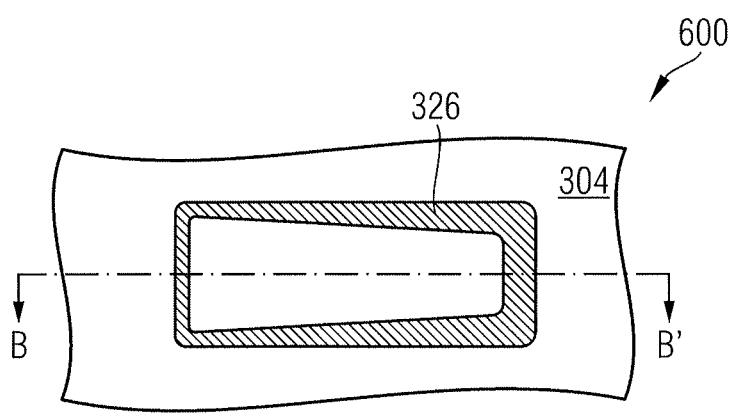
Figure 6B:
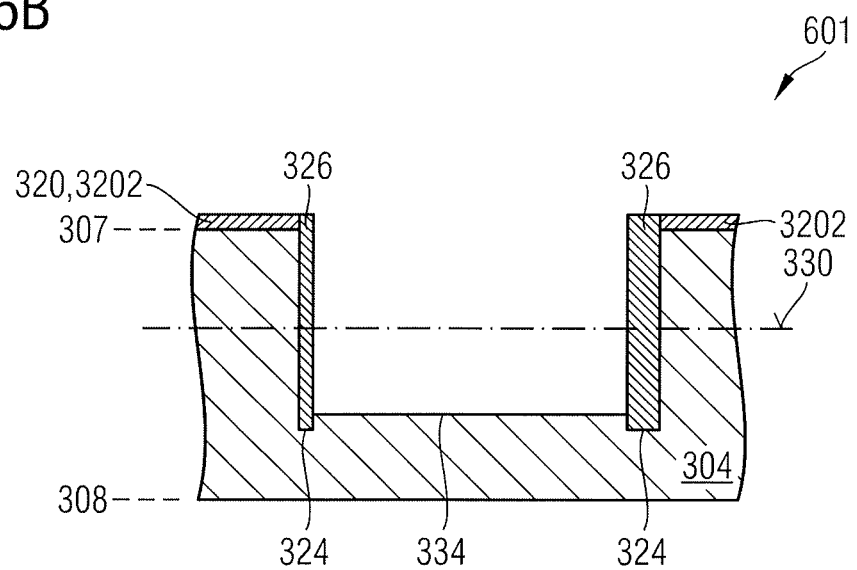

Referring to a schematic top view 600 of the semiconductor body 304 illustrated in FIG. 6A and a schematic cross-sectional view 601 along cut line B-B' of FIG. 6A, a second trench 334 is formed in the semiconductor body 304 in an area where the first mask 320 has been removed beforehand. The second trench 334 is surrounded by the first trench 324 that is filled with the first material 326. Depths of the first and second trenches 324, 334 may be equal or slightly different. The second trench 334 may be formed by an etch process, for example by an dry etch process such as reactive-ion etching, for example.

Figure 7A:
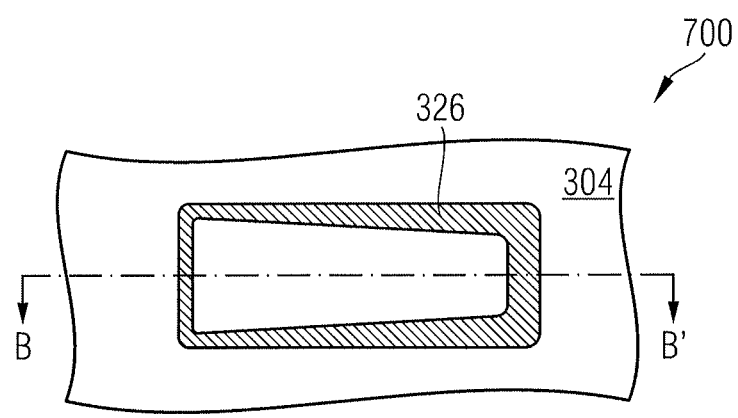
Figure 7B:
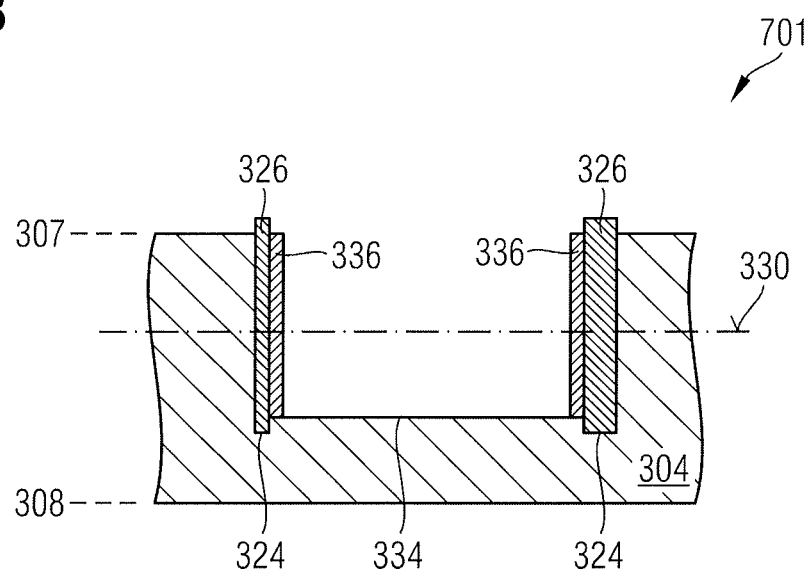

Referring to a schematic top view 700 of the semiconductor body 304 illustrated in FIG. 7A and a schematic cross-sectional view 701 along cut line B-B' of FIG. 7A, sidewalls of the second trench 334 are lined with a second material 336. The second material 336 may be formed directly on the first material 326. The second material 336 may be formed by a spacer etch process, for example. In some embodiments, the second material is a dielectric material, for example a dielectric material different from the first material. In some embodiments, the first material includes an oxide of silicon and the second material includes a nitride of silicon.

Figure 8A:
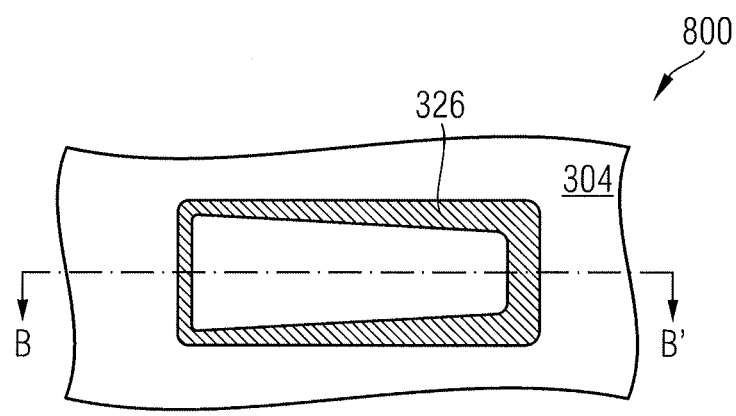
Figure 8B:
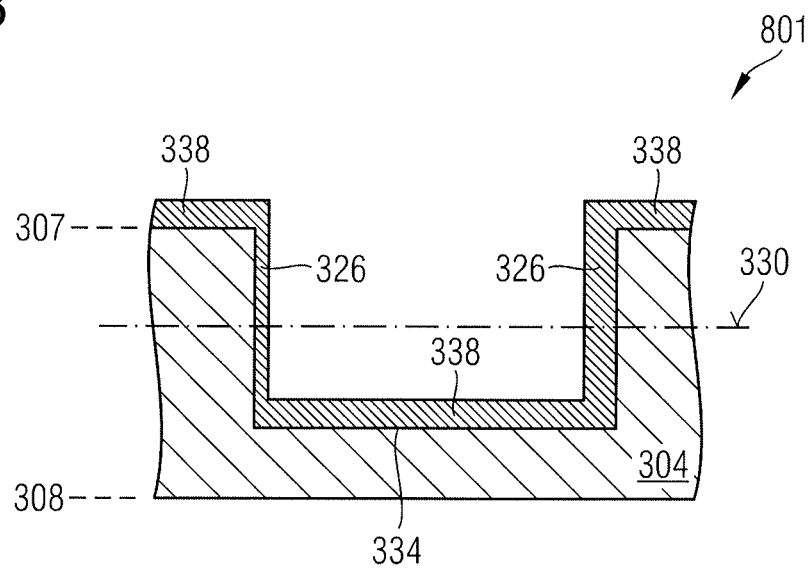

Referring to a schematic top view 800 of the semiconductor body 304 illustrated in FIG. 8A and a schematic cross-sectional view 801 along cut line B-B' of FIG. 8A, a third material 338 is formed at a bottom side of the second trench 334. In some embodiments, the third material is a dielectric material, for example a thermal oxide. A thermal oxidation process of a semiconductor body made of silicon may lead to formation of a thermal oxide at uncovered parts of silicon, for example at the bottom side of the second trench 334 and at the first surface 307 whereas thermal oxidation may be suppressed at other parts of the semiconductor body 304, for example at sidewalls of the second trench 334 covered with the second material 336. After formation of the third material, the second material 336 may be removed. The first and third materials 326, 338 may constitute a field dielectric, for example.

Figure 9A:
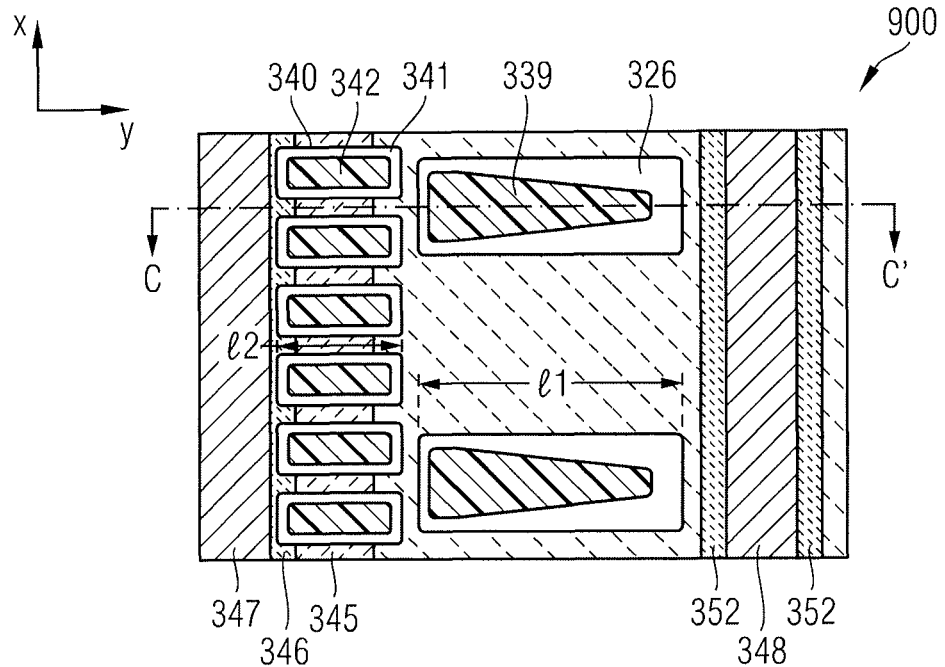

The processes illustrated with reference to FIGS. 3A to 8B together with a number of further processes carried out before, between, after or together with processes described above with reference to FIGS. 3A to 8B may be carried out for manufacturing a semiconductor device as is illustrated in a schematic top view 900 of the semiconductor body 304 in FIG. 9A and in a schematic cross-sectional view 901 along cut line B-B' of FIG. 9A.

A fourth material 339, for example a conductive material such as highly doped polycrystalline silicon and/or metal may be formed in the second trench 334 and constitutes a field electrode in a field electrode trench. The field dielectric comprising the first and third materials 326, 338 electrically isolates the field electrode from a surrounding portion of the semiconductor body 304.

The semiconductor body 304 may include a semiconductor substrate 3401 and an epitaxial layer 3402 on the semiconductor substrate. A highly doped buried layer 3403 may be arranged between the semiconductor substrate 3401 and the epitaxial layer 3402.

Gate trenches 340 including a gate dielectric 341 and a gate electrode 342 may be formed at a lateral distance from the second trench 334. The gate dielectric 341 and the gate electrode 342 may also be formed on the semiconductor body 304 at the first surface 307, thereby lining sidewalls and a top side of a fin formed in the semiconductor body 304.

A body region 345 may be formed in the epitaxial layer 3402, the body region having a conductivity type different from the conductivity type of the epitaxial layer 3402. A conductive channel region may be formed at a top side of the body region 345 at an interface to the gate dielectric 341, for example by applying a voltage to the gate electrode 342.

Source and drain trench contacts 347, 348 may be formed at the first surface 307. A material of the source and drain trench contacts 347, 348 may include highly doped semiconductor material(s), for example highly doped polycrystalline silicon and/or metal(s). A highly doped source/body contact region 350 may be located between the source trench contact 347 and the body region 345 for reducing a contact resistance in between. Alternatively or in addition, a highly doped source/body contact region may also be located at the first surface 307, for example interrupting a source region extending along a direction perpendicular to the drawing plane of FIG. 9B. A highly doped source region 346 may adjoin the source trench contact 347. A highly doped drain contact region 352 may be located between the drain trench contact 348 and the epitaxial layer 3402 for reducing a contact resistance in between. The source trench contact 347 may be electrically connected to a source terminal S. The drain trench contact 348 may be electrically connected to a drain terminal D. The gate electrode 342 may be electrically connected to a gate terminal G. The field electrode formed of the fourth material 339 may be electrically connected to a field plate terminal FP, which may equal one of present terminals such as the source terminal S, for example.

Figure 9B:
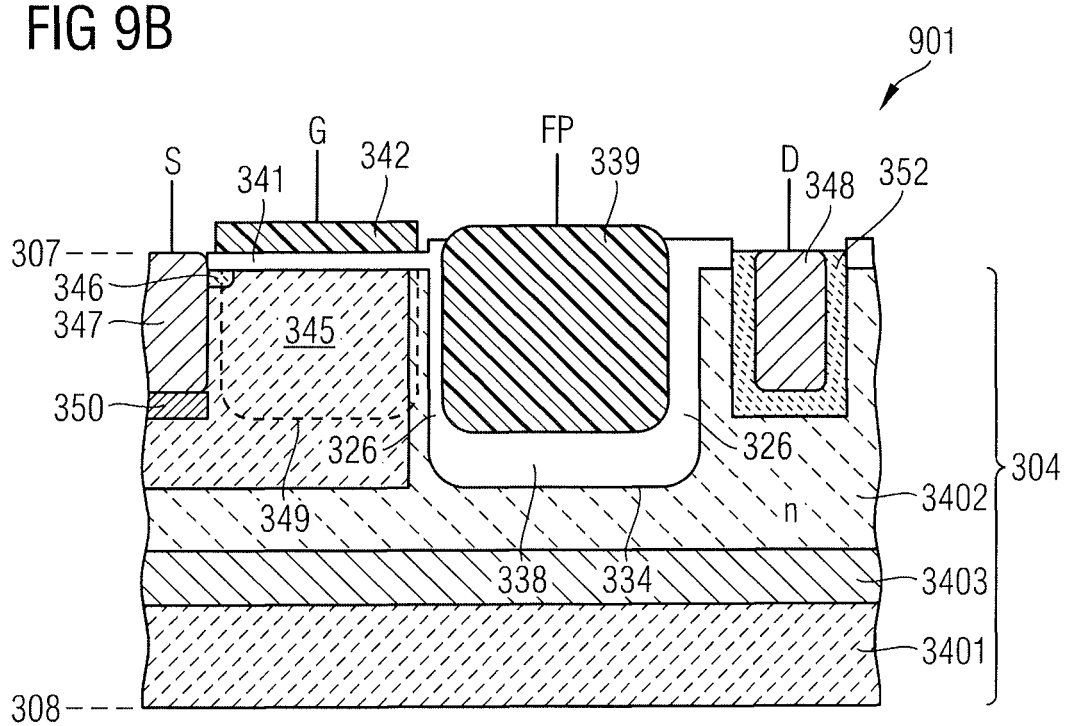

A dashed line 349 indicates a boundary of the gate trench 340 in a cross-sectional plane before or behind the cross-section illustrated in FIG. 9B.

The source trench contact 347, the gate trench 340, the field electrode trench and the drain trench contact 348 are consecutively arranged along the first lateral direction x.

In some embodiments, a number of gate trenches 340 consecutively arranged along the second lateral direction y other than the first lateral direction x may be larger than a number of field electrode trenches consecutively arranged along the second lateral direction y.

In some embodiments, a first dimension 11 of each of the field electrode trenches along the first lateral direction x is greater than a second dimension 12 of each of the gate trenches 340 along the first lateral direction x. A portion of the semiconductor body 304 between field electrode trenches may constitute a drain extension region, for example.

In some embodiments, a minimum thickness of the field dielectric at sidewalls of the field electrode trench is equal or greater than a thickness of the gate dielectric 341 in the gate trench 340.

In some embodiments, a depth of the field electrode trench is greater than a depth of the gate trench 340. The depth may be measured between the first surface 307 and a bottom side of the gate and field electrode trenches, respectively.

In some embodiments, the semiconductor device is a power Fin IGFET such as a power FinFET.

The method described with reference to FIG. 1 may be applied to any kind of structures where an inner structure and an outer structure encompassing the inner structure are to aligned with respect to each other. Apart from trench dielectric(s) comprising varying lateral widths at sidewalls of trenches, also an emitter region of a BJT may be aligned with respect to a base region, for example.

Although semiconductor regions provided for similar purpose in the different embodiments described herein may be denoted by same reference numerals, dimensions and doping concentrations may differ between the different embodiments.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a structure in a semiconductor body, the method comprising:
    forming a first mask above a first surface of the semiconductor body, the first mask comprising a first opening surrounding a first portion of the first mask, thereby separating the first portion and a second portion of the first mask;
    processing the semiconductor body through the first opening at the first surface;
    increasing the first opening to a second opening by removing at least part of the first mask in the first portion while maintaining the first mask in the second portion; and
    further processing the semiconductor body through the second opening at the first surface,
    wherein the first opening constitutes a loop at the first surface, a width of the loop at the first surface varying between a first width and a second width, a ratio between the first and second widths being greater than two,
    wherein processing the semiconductor body through the first opening at the first surface comprises forming a first trench in the semiconductor body, and
    wherein the first trench is an electrode trench.

2. The method of claim 1, wherein increasing the first opening comprises completely removing the first mask in the first portion.

3. The method of claim 1, wherein increasing the first opening further comprises forming a second mask above the first mask, the second mask covering the second portion of the first mask and comprising an opening above the at least part of the first mask in the first portion.

4. The method of claim 1, wherein processing the semiconductor body through the first opening at the first surface further comprises filling the first trench with a first material.

5. The method of claim 4, wherein filling the first trench with a first material includes forming a first dielectric, and wherein a projection of the first material on the first surface constitutes a loop, a width of the first material at half of a depth between the first surface and a bottom side of the first trench varying between a first width and a second width along the loop, a ratio between the first and second widths being greater than two.

6. The method of claim 5, wherein further processing the semiconductor body through the second opening at the first surface includes forming a second trench in the semiconductor body.

7. The method of claim 6, further comprising lining sidewalls of the second trench with a second material.

8. The method of claim 7, wherein the second material is formed directly on the first material.

9. The method of claim 7, wherein the first dielectric is a field dielectric comprising an oxide of silicon.

10. The method of claim 9, further comprising:
    forming a second dielectric at a bottom side of the second trench and in direct contact with the first dielectric; and
    forming a conductive material in the second trench.

11. The method of claim 10, further comprising:
    forming a gate trench at a lateral distance from the second trench;
    forming a gate dielectric and a gate electrode in the gate trench; and
    forming source and drain contacts at the first surface, wherein the source contact, the gate trench, the second trench and the drain contact are consecutively arranged along a first lateral direction.

12. The method of claim 11, wherein forming at least one of the source and drain contacts comprises forming a contact trench in the semiconductor body.

13. The method of claim 11, wherein forming the gate trench comprises forming a plurality of gate trenches consecutively arranged along a second lateral direction other than the first lateral direction, and wherein the first mask comprises a plurality of openings and first portions arranged along the second lateral direction.

14. A method of manufacturing a structure in a semiconductor body, the method comprising:
    forming a first mask above a first surface of the semiconductor body, the first mask comprising a first opening surrounding a first portion of the first mask, thereby separating the first portion and a second portion of the first mask;

processing the semiconductor body through the first opening at the first surface;

increasing the first opening to a second opening by removing at least part of the first mask in the first portion while maintaining the first mask in the second portion; and further processing the semiconductor body through the second opening at the first surface, wherein the first opening constitutes a loop at the first surface, a width of the loop at the first surface varying between a first width and a second width, a ratio between the first and second widths being greater than two, wherein processing the semiconductor body through the first opening at the first surface comprises forming a first trench in the semiconductor body and filling the first trench with a first material, wherein filling the first trench with a first material includes forming a first dielectric, and wherein a projection of the first material on the first surface constitutes a loop, a width of the first material at half of a depth between the first surface and a bottom side of the first trench varying between a first width and a second width along the loop, a ratio between the first and second widths being greater than two, and wherein further processing the semiconductor body through the second opening at the first surface includes forming a second trench in the semiconductor body.

15. The method of claim 14, further comprising lining sidewalls of the second trench with a second material.

16. The method of claim 15, wherein the second material is formed directly on the first material.

17. The method of claim 15, wherein the first dielectric is a field dielectric comprising an oxide of silicon.

18. The method of claim 17, further comprising:
forming a second dielectric at a bottom side of the second trench and in direct contact with the first dielectric; and
forming a conductive material in the second trench.

19. The method of claim 18, further comprising:
forming a gate trench at a lateral distance from the second trench;
forming a gate dielectric and a gate electrode in the gate trench; and
forming source and drain contacts at the first surface, wherein the source contact, the gate trench, the second trench and the drain contact are consecutively arranged along a first lateral direction.

20. A method of manufacturing a structure in a semiconductor body, the method comprising:

forming a first mask above a first surface of the semiconductor body, the first mask comprising an opening surrounding a first portion of the first mask, thereby separating the first portion and a second portion of the first mask;

processing the semiconductor body through the opening at the first surface;

increasing the opening by removing at least part of the first mask in the first portion while maintaining the first mask in the second portion; and further processing the semiconductor body through the opening at the first surface, wherein the opening constitutes a loop at the first surface, a width of the loop at the first surface varying between a first width and a second width, a ratio between the first and second widths being greater than two, wherein processing the semiconductor body through the opening at the first surface comprises forming a first trench in the semiconductor body and filling the first trench with a first material, wherein filling the first trench with a first material includes forming a first dielectric, and wherein a projection of the first material on the first surface constitutes a loop, a width of the first material at half of a depth between the first surface and a bottom side of the first trench varying between a first width and a second width along the loop, a ratio between the first and second widths being greater than two, and wherein further processing the semiconductor body through the opening at the first surface includes forming a second trench in the semiconductor body.

* * * * *